United States Patent
Bartley et al.

(10) Patent No.: US 8,823,090 B2
(45) Date of Patent: Sep. 2, 2014

(54) FIELD-EFFECT TRANSISTOR AND METHOD OF CREATING SAME

(75) Inventors: Gerald K Bartley, Rochester, MN (US); Darryl J Becker, Rochester, MN (US); Philip R Germann, Oronoco, MN (US); Andrew B Maki, Rochester, MN (US); John E Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 591 days.

(21) Appl. No.: 13/029,490

(22) Filed: Feb. 17, 2011

(65) Prior Publication Data

US 2012/0211829 A1    Aug. 23, 2012

(51) Int. Cl.
  *H01L 29/772* (2006.01)
(52) U.S. Cl.
  USPC .......... 257/332; 257/774; 257/E29.262; 257/E23.174; 257/330
(58) Field of Classification Search
  USPC .......... 257/330, 332, 774, E23.174, E29.262
  See application file for complete search history.

(56) References Cited

U.S. PATENT DOCUMENTS

| | | | |
|---|---|---|---|
| 5,312,782 A * | 5/1994 | Miyazawa | 438/270 |
| 5,801,417 A | 9/1998 | Tsang et al. | |
| 6,657,254 B2 | 12/2003 | Hshieh et al. | |
| 7,504,303 B2 | 3/2009 | Yilmaz et al. | |
| 7,625,793 B2 | 12/2009 | Calafut | |
| 7,633,165 B2 | 12/2009 | Hsu et al. | |
| 7,843,064 B2 | 11/2010 | Kuo et al. | |
| 7,919,376 B2 * | 4/2011 | Kim | 438/272 |
| 8,466,024 B2 | 6/2013 | Bartley et al. | |
| 8,492,903 B2 | 7/2013 | Bartley et al. | |
| 2007/0052056 A1 | 3/2007 | Doi et al. | |
| 2009/0243676 A1 | 10/2009 | Feng | |
| 2010/0032764 A1 | 2/2010 | Andry et al. | |
| 2010/0259296 A1 | 10/2010 | Or-Bach | |
| 2011/0266683 A1 | 11/2011 | Feng | |
| 2012/0088339 A1 * | 4/2012 | Molin et al. | 438/138 |
| 2012/0211829 A1 | 8/2012 | Bartley et al. | |

OTHER PUBLICATIONS

U.S. Appl. No. 13/171,919, filed Jun. 29, 2011.
U.S. Appl. No. 12/966,303 entitled "Power Domain Controller With Gated Through Silicon Via Having FET With Horizontal Channel", filed Dec. 13, 2010.
Takashi Yoshinaga and Minoru Nomura, "Trends in R&D in TSV Technology for 3D LSI Packaging." Science & Technology Trends. Quarterly Review No. 37, pp. 26-39, Oct. 2010.
Soon Wee Ho, Seung Wook Yoon, Qiaoer Zhou, Krishnamachar Pasad, Vaidyanathan Kripesh, and John H. Lau. "High RF Performance TSV Silicon Carrier for High Frequency Application." Electronic Components and Technology Conference, 2008. ECTC 2008. 58th, pp. 1946-1952, May 27-30, 2008.

* cited by examiner

*Primary Examiner* — Matthew W Such
*Assistant Examiner* — Scott Stowe
(74) *Attorney, Agent, or Firm* — Nicholas L. Cadmus; Edward A. Gecovich (57) ABSTRACT

A field-effect transistor has a gate, a source, and a drain. The gate has a via extending through a semiconductor chip substrate from one surface to an opposite surface of the semiconductor chip substrate. The source has a first toroid of ion dopants implanted in the semiconductor chip substrate surrounding one end of the via on the one surface of the semiconductor chip substrate. The drain has a second toroid of ion dopants implanted in the semiconductor chip substrate surrounding an opposite end of the via on the opposite surface of the semiconductor chip substrate.

11 Claims, 7 Drawing Sheets

FIELD-EFFECT TRANSISTOR AND METHOD OF CREATING SAME

FIELD OF THE INVENTION

The present invention relates generally to integrated circuits (also known as "semiconductor circuits" or "chips"), and more specifically to controlling power delivery to portions of the integrated circuit.

BACKGROUND

A wide range of semiconductor circuits are well known today using a wide range of known technology. Increasing demand for high performance, multi-functional semiconductor circuits challenges semiconductor designers to incorporate more semiconductor components into limited space. It is known to increase volumetric density of semiconductor packaging by packaging semiconductor chips in "chip stacks", interconnecting a number of the semiconductor chips using conductive connections such as solder ball or other techniques to provide electrical connections between the chips in the chip stack.

It was known to manufacture microprocessors as semiconductor circuits with compartmentalized structures having multiple functions. A multi-core processor, for example, incorporates two or more processors into a single integrated circuit.

System-on-chip architecture is also known where several system components are formed as a single integrated circuit. In such architectures, the components of the integrated circuit may not all operate simultaneously. It was known to utilize clock-gating techniques to eliminate the switching portion of the power dissipation from unused circuits (leaving only the DC leakage power). It was also known to dynamically disconnect power to portions of an integrated circuit that are not currently operating. This further reduces power consumption.

It was known to use a field effect transistor having a gate, source, and drain, controlled by a power gating controller, as a switch to selectively and dynamically disconnect power to inactive portions of an integrated circuit to reduce power consumption. Using standard transistors for power switching however results in leakage power. Leakage power is to first order inversely proportional to transistor length. Specifically, longer transistors leak less than shorter transistors. Power leakage is generally tracked by a constant divided by the channel length. Also, the known transistors used to selectively gate power to portions of the integrated circuit take up valuable surface area on the semiconductor chip which may be needed for other circuitry.

Figure 1:
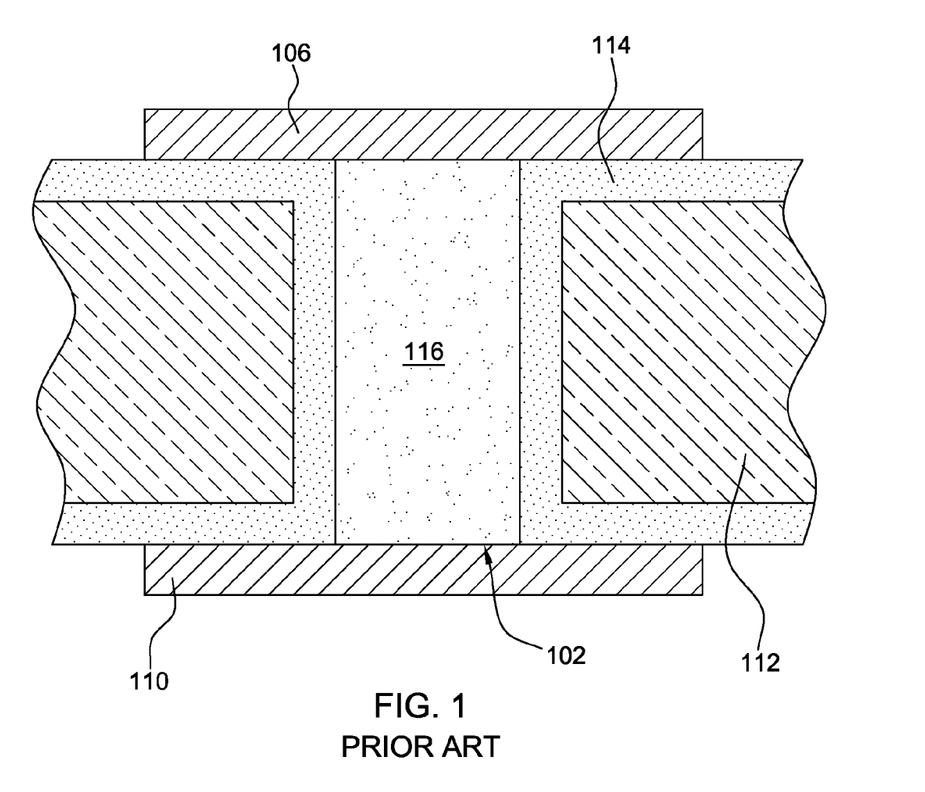
FIG. 1 illustrates a through-silicon via structure for transferring power between a top surface of a silicon chip and a bottom surface of the silicon chip, according to the Prior Art.

Through-silicon via (TSV) technology was known for power distribution within chip-stacking, multi-core and system-on-chip architectures. TSV technology conserves valuable chip surface area by using through holes, filled with a conductive material, in a silicon substrate to form an electrical connection between the top and bottom surfaces of a chip. FIG. 1 illustrates a standard through-silicon via (TSV) structure 102 for delivering power from a top silicon chip through a top bond pad 106 to a bottom silicon chip through a bottom bond pad 110. TSV 102 is filled with conductive material 116 which provides an electrical pathway through semiconductor chip 112 between top silicon chip and bottom silicon chip. TSV 102, top bond pad 106, and bottom bond pad 110 are electrically isolated from semiconductor chip 112 by dielectric coated region 114.

An object of the present invention is to selectively control power delivery to active portions of an integrated circuit, yet minimize power leakage and amount of semiconductor surface area used for the selective power delivery.

SUMMARY

In a first embodiment of the present invention, a field-effect transistor has a gate, a source, and a drain. The gate has a via extending through a semiconductor chip substrate from one surface to an opposite surface of the semiconductor chip substrate. The source has a first toroid of ion dopants implanted in the semiconductor chip substrate surrounding one end of the via on the one surface of the semiconductor chip substrate. The drain has a second toroid of ion dopants implanted in the semiconductor chip substrate surrounding an opposite end of the via on the opposite surface of the semiconductor chip substrate.

In a second embodiment of the present invention, a field-effect transistor is constructed by first etching a via into a semiconductor chip substrate. The via is then coated with a dielectric material. A first toroid of ion dopants is implanted at a first surface of the semiconductor chip substrate. A second toroid of ion dopants is implanted at a second surface of the semiconductor chip substrate. The via is then filled with a conductive material.

In a third embodiment of the present invention, a field-effect transistor (FET) has a via extending through a semiconductor chip substrate from one surface to an opposite surface of the semiconductor chip substrate. The FET has a first series of ion dopants implanted in the semiconductor chip substrate at a first energy level surrounding one end of the via on the one surface of the semiconductor chip substrate. The FET has a second series of ion dopants implanted in the semiconductor chip substrate at the first energy level surrounding an opposite end of the via on the opposite surface of the semiconductor chip substrate. The FET has first and second supplemental series of ion dopants implanted at a second energy level in the semiconductor chip substrate surrounding the via at the one end of the via and at the opposite end of the via respectively. The first and second series of ion dopants are implanted at a 45 degree angle relative to the one surface and the opposite surface respectively. The first and second supplemental series of ion dopants are implanted parallel to the one surface of the semiconductor chip substrate.

DETAILED DESCRIPTION

Figure 2A:
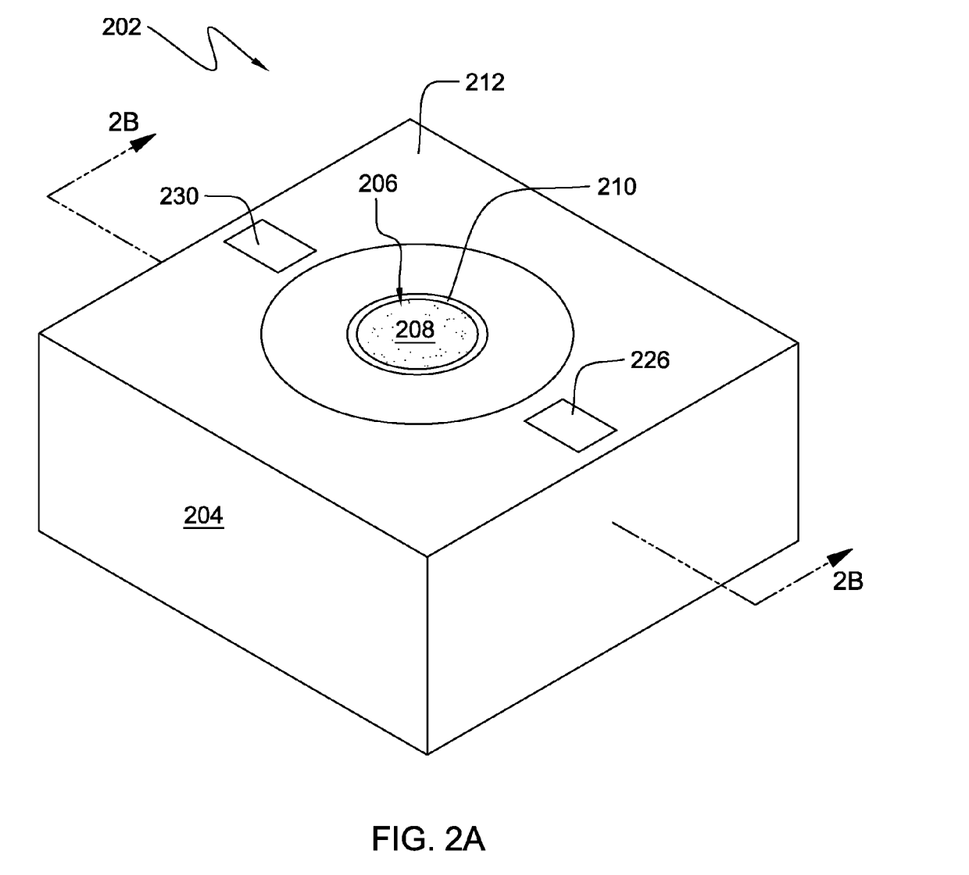
FIG. 2A is a figurative perspective view of a switchable through-silicon via field-effect transistor for transferring power between a top surface of a silicon chip and a bottom surface of the silicon chip, according to the present invention.
Figure 2B:
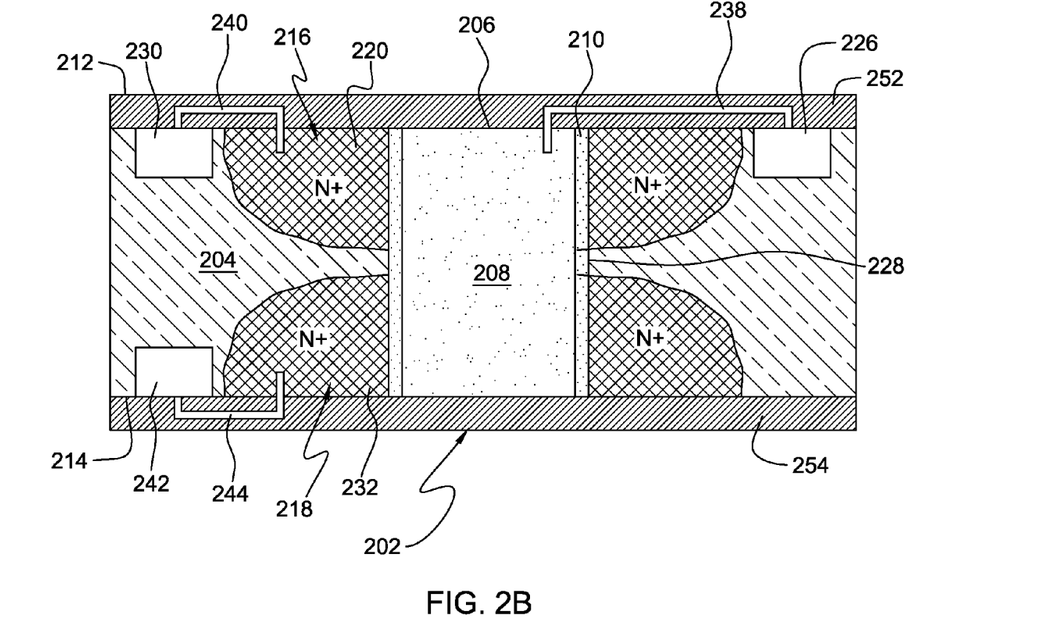
FIG. 2B illustrates a cross-sectional side view of the switchable through-silicon via field-effect transistor of FIG. 2A, along the plane 2B of FIG. 2A.

The present invention will now be described with reference to the figures. Embodiments of the present invention dynamically deliver power to portions of a semiconductor chip that are currently operating and block delivery of power to other portions of the semiconductor chip that are not currently operating. Although such gating is not limited to delivery of power directly from voltage supply lines, a voltage supply line is used herein for exemplary purposes. FIG. 2A illustrates a switchable through-silicon via (TSV) field-effect transistor (FET) 202. FIG. 2B illustrates a cross-sectional side view of TSV FET 202 of FIG. 2A. TSV FET 202 transfers power between a top voltage supply line 240 in a top surface 212 of a semiconductor chip 204 to a bottom voltage supply line 244 in a bottom surface 214 of the semiconductor chip 204 when TSV FET 202 is gated "on" but does not transfer the power when TSV FET 202 is gated "off", according to one embodiment of the present invention. Top voltage supply line 240 is coupled to top integrated circuit functional unit 230 via first wiring region 252. Bottom voltage supply line 244 is coupled to bottom integrated circuit functional unit 242 via second wiring region 254.

TSV FET 202 is switchable to control delivery of power from a first integrated circuit functional unit 230 at the top surface 212 of semiconductor chip 204 where power is available to a second integrated circuit functional unit 242 at the bottom surface 214 of semiconductor chip 204 where power is then available. Alternatively, TSV FET 202 is switchable to control delivery of power from second integrated circuit functional unit 242 at bottom surface 214 of semiconductor chip 204 where power is available to first integrated circuit functional unit 230 at top surface 214 of semiconductor chip 204 where power is then available. In an example embodiment, first integrated circuit functional unit 230 is a conductor for supplying a power supply voltage. TSV FET 202 may be controlled or switched using control logic 226 from either top surface 212 or bottom surface 214 of semiconductor chip 204, although FIG. 2A illustrates control from the top surface 212.

Figure 3:
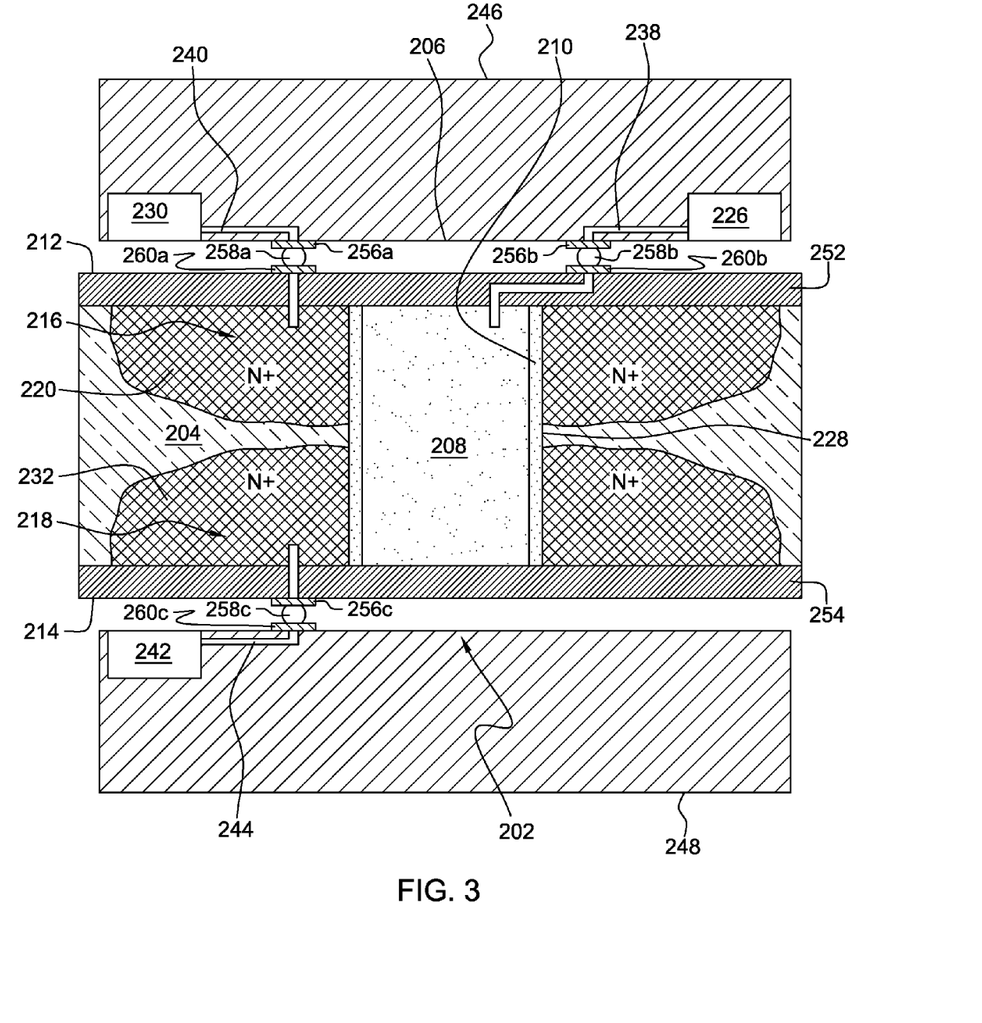
FIG. 3 illustrates a switchable through-silicon via field-effect transistor for transferring power between a second silicon chip and a third silicon chip, according to an aspect of the present invention.

In one example, as illustrated in FIG. 3, a second silicon chip 246 is stacked on top of TSV FET 202 and a third silicon chip 248 is stacked under TSV FET 202. Second silicon chip 246 is separated from TSV FET 202 by first wiring region 252 and third silicon chip 248 is separated from TSV FET 202 by second wiring region 254. In this example, TSV FET 202 is switchable to control delivery of power from first integrated circuit functional unit 230 on second silicon chip 246 where power is available to second integrated circuit functional unit 242 on third silicon chip 242 where power is then available. Alternatively, TSV FET 202 is switchable to control delivery of power from second integrated circuit functional unit 242 on third silicon chip 248 where power is available to first integrated circuit functional unit 230 on second silicon chip 246 where power is then available. Similarly, the gate of TSV FET 202 may be controlled or switched using control logic 226 from either the second silicon chip 246 or the third silicon chip 248 although FIG. 3 illustrates control from second silicon chip 246. Electrical connections for first integrated circuit functions unit 236, second integrated function unit 242, and control logic 226 are formed, through first wiring region 252 and second wiring region 254, using top bond pad 256, solder ball 258, and bottom bond pad 260.

Referring back to FIGS. 2A and 2B, TSV FET 202 has a through silicon via (TSV) 206 passing vertically through semiconductor chip 204. TSV 206 is filled with conductive material 208 which provides an electrical pathway through the substrate of semiconductor chip 204. Conductive material 208 may be a metal such as tungsten, or it may be another conducting material such as doped poly-silicon. TSV 206 is electrically isolated from semiconductor chip 204 by dielectric coated region 210. Dielectric coated region 210 may be $SiO_2$, $HfO_2$, or other suitable dielectric material. TSV 206 thus serves as the gate of TSV FET 202. TSV 206 is connected to control logic 226 via control line 238 for switching TSV FET 202. Control logic 226 switches TSV FET 202 "on" to transfer power and "off" to stop transferring power. Although control logic 226 is illustrated as being coupled to the top of semiconductor chip 204, it should be understood that alternatively, control logic 226 may be coupled to the bottom of semiconductor chip 204.

TSV FET 202 has a source 216 and a drain 218. It is to be understood that although the figures depict source 216 at the top of the TSV 206 and drain 218 at the bottom of TSV 206, TSV FET 202 is bi-directional, and therefore source 216 can act as a drain and drain 218 can act as a source. It is to be further understood that although the figure depicts source 216 and drain 218 as N-type regions for an NFET embodiment of TSV FET 202, source 216 and drain 218 can also be P-type regions for a PFET embodiment of TSV FET 202.

Source 216 is made up of a first region of ion dopants 220 implanted into semiconductor chip 204 through top surface 212. Drain 218 is made up of second region of ion dopants 232 implanted into semiconductor chip 204 through bottom surface 214. First region of ion dopants 220 and second region of ion dopants 232 result in a first toroid around the perimeter of TSV 206 at the top of TSV 206 and a second toroid around the perimeter of TSV 206 at the bottom of TSV 206 respectively. The first and second toroids of ion dopants 220 and 232 are initially substantially L-shaped as depicted in FIG. 4C but expand in shape after being subjected to an annealing process. For example, the annealing process causes toroid of ion dopants 220 to expand in volume and bow outwards, away from top surface 212 of semiconductor chip 204 and away from TSV 206. Similarly, the annealing process causes toroid of ion dopants 232 to expand in volume and bow outwards, away from bottom surface 214 of semiconductor chip 204 and away from TSV 206.

As will be illustrated in FIGS. 4C-4F, source 216 includes a first series of ion dopants 222 and a first supplemental series ion dopants 224 implanted through top surface 212 of semiconductor chip 204 and drain 218 includes a second series ion dopants 234 and a second supplemental series of ion dopants 236 implanted through bottom surface 214 of semiconductor chip 204. By way of example, first series of ion dopants 222 and second series of ion dopants 232 are implanted at a 30°-60° angle from the surface of semiconductor chip 204, preferably at approximately 45°, resulting in significant depth of the implants.

First supplemental series ion dopants 224 is implanted substantially uniformly from the top surface 212 to create parallel diffusion into the substrate of semiconductor chip 204. Second series of supplemental ion dopants 236 is implanted substantially uniformly from the bottom surface 214 to create parallel diffusion into substrate of semiconductor chip 204. First supplemental series of ion dopants 224 is positioned to supplement first series of ion dopants 222. Second supplemental series of ion dopants 236 is positioned to supplement second series of ion dopants 234. First series of ion dopants 222 and first supplemental series of ion dopants 224 are implanted at different energies. For example, first series of ion dopants 222 is a 50 KeV implant and first supplemental series of ion dopants 224 is a 250 KeV implant. Similarly, second series of ion dopants 234 and second supplemental series of ion dopants 236 are implanted at different energies.

Referring back to FIG. 2B, the region 228 of TSV 206 between source 216 and drain 218 serves as a channel 228 of TSV FET 202. Channel 228 is kept relatively short to improve performance of TSV FET 202. For example, the depth of series of ion implants 220 equals the diameter of TSV 206 and the height of TSV FET 202 is slightly more then twice the diameter of TSV 206. This results in relatively deep (drain and source) implants around TSV 206 and in turn a narrow channel 228. It is to be understood that the example described assumes first series of ion dopants 222 and second series of ion dopants 232 are implanted at approximately 45°. If the angle of implant is substantially greater than or less than 45°, either the height of TSV FET 202 or the diameter of TSV 206 would need to be adjusted to avoid overlapping source 216 and rain 218 (or widely separated source 216 and drain 218).

The current that flows through TSV FET 202 is proportional to the width of the TSV FET 202 divided by the length of channel 228, wherein the width of TSV FET 202 is the inner diameter of the toroids of ion implants 220 and 232 serving as the source 216 and drain 218 of TSV FET 202. Increasing the width of TSV FET 202 requires additional surface area on semiconductor chip 204 which may not be available depending on the design of semiconductor chip 204. Creating a relatively narrow channel 228 by implanting series of ion dopants 222 and 234 at an angle, however, results in a large TSV FET 202 width-to-length ration which allows for increased current flow through TSV FET 202 without requiring additional area on semiconductor chip 204. At the same time, however, channel 228 is sufficiently long enough to prevent excessive leakage. Supplemental series of ion dopants 224 and 236 increase the doping concentration at the surfaces 212 and 214 of semiconductor chip 204 to enable low ohmic diffusion contacts. Additionally, supplemental series of ion dopants 224 and 236 aid in maximizing the total area of the relatively narrow channel 228 by reducing series resistance through channel 228 and thereby further increasing the current that can flow through channel 228.

Figure 4A:
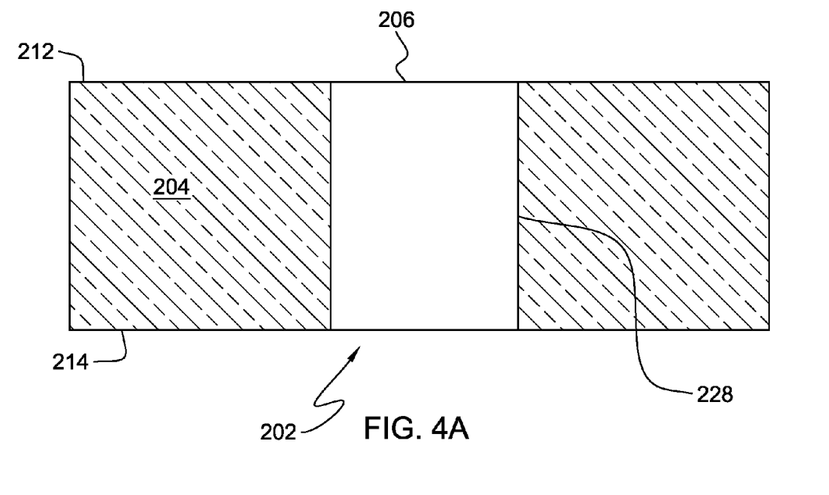
FIG. 4A illustrates a stage in the manufacture of the switchable through-silicon via field-effect transistor of FIG. 2A.
Figure 4B:
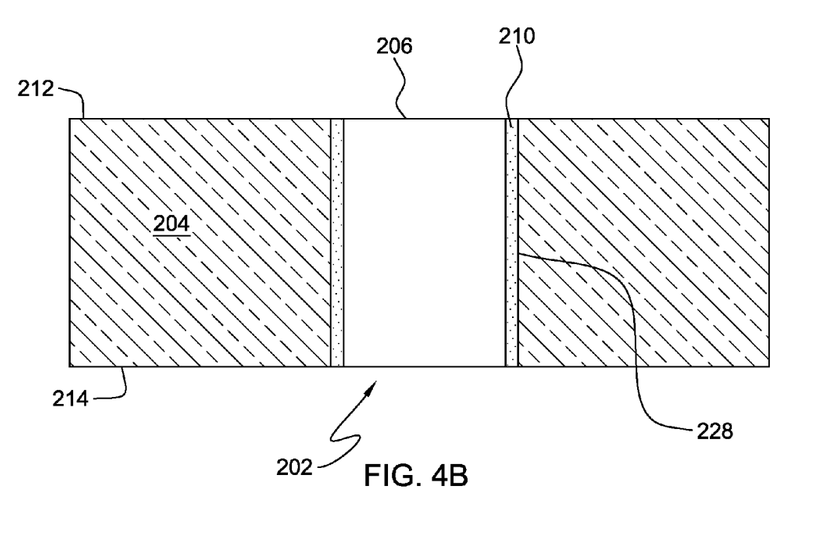
FIG. 4B illustrates a stage in the manufacture of the switchable through-silicon via field-effect transistor of FIG. 2A, subsequent to the stage of FIG. 4A.
Figure 4C:
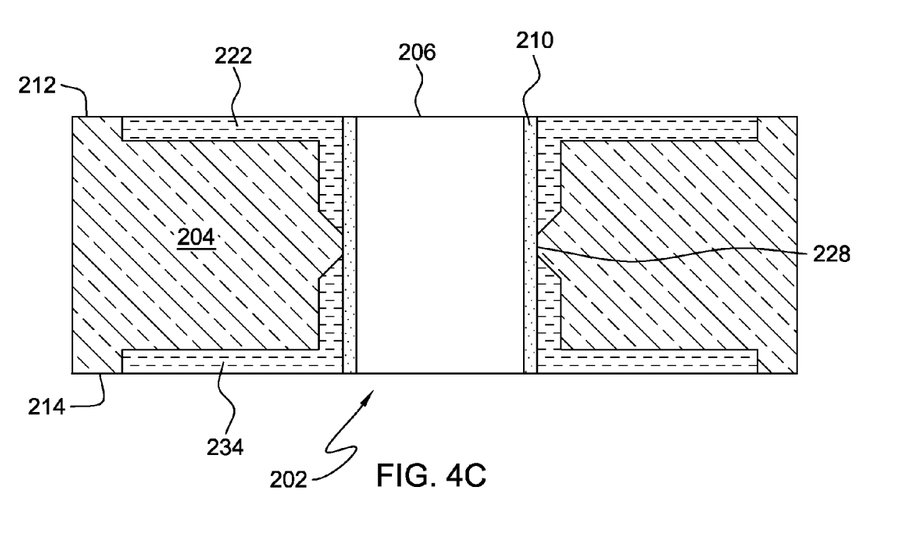
FIG. 4C illustrates a stage in the manufacture of the switchable through-silicon via field-effect transistor of FIG. 2A, subsequent to the stage of FIG. 4B.

FIGS. 4A-4F illustrates stages in manufacture of the switchable through-silicon via (TSV) field effect transistor (FET) 202. In FIG. 4A, TSV 206 is etched into and through semiconductor chip 204 for example, using a known etchant such as a liquid phase etchant or a plasma-phase etchant. In one example, the diameter of etched TSV 206 is slightly less then half of the thickness of semiconductor chip 204. For example, a 20 um diameter TSV 206 is etched into a 45 um thick semiconductor ship 204.

In FIG. 4B, TSV 206 is coated with a dielectric material. In one example, the dielectric material is deposited on the walls of TSV 206 before filling the TSV with the conductive material. Alternatively, dielectric material is thermally grown on the walls of TSV 206. In one example, high dielectric constant material such as $SiO_2$ or $HfO_2$ is used to enhance gate capacitance to the surrounding silicon.

In FIG. 4C, a first series of ion dopants 222 are implanted at an angle around the perimeter of TSV 206 at the top 212 of semiconductor chip 204. In one example, the first series of ion dopants 222 are implanted at 45°. For example, the series of ion dopants 222 are implanted by rotating semiconductor chip 204 360° while an ion implantation device is held stationary. Alternatively, semiconductor chip 204 is held in a fixed position and the first series of ion dopants 222 is implanted by rotating an ion implantation device 360°. First series of ion dopants 222 forms a substantially L-shaped toroid around perimeter of TSV 206 at the top 212 of semiconductor chip 204.

In one example, the top surface 212 of semiconductor chip 204 is covered with an ion implementation mask such as a photoresist prior to implanting the ion dopants. The ion implementation mask helps guide the implantation of ion dopants to specific areas of the semiconductor chip 204. In an example embodiment, a hole in the ion implementation mask is twice as large as the diameter of TSV 206.

Figure 4D:
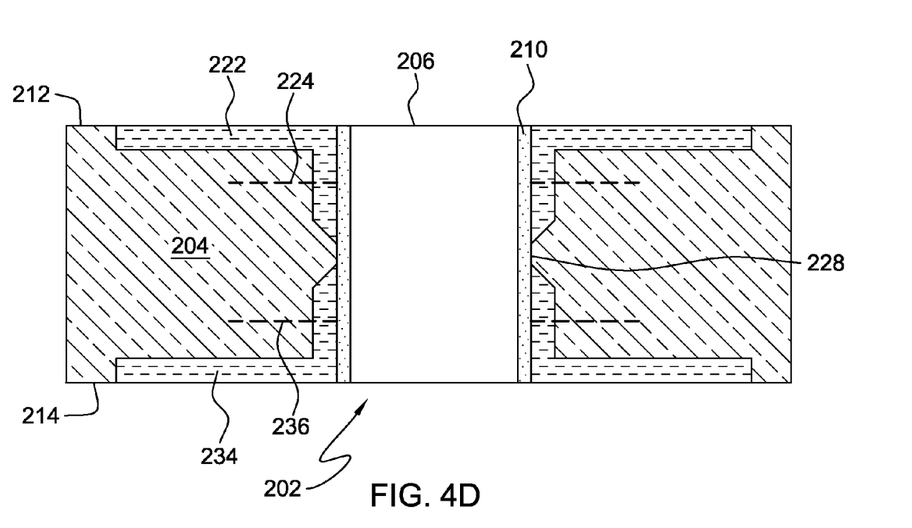
FIG. 4D illustrates a stage in the manufacture of the switchable through-silicon via field-effect transistor of FIG. 2A, subsequent to the stage of FIG. 4C.

In FIG. 4D, a first supplemental series of ion dopants 224 is implanted through top surface 212 of semiconductor chip 204. First series of supplemental ion dopants 224 is implanted parallel to top surface 212 of semiconductor chip 204 and is positioned to supplement first series of ion dopants 222.

Figure 4E:
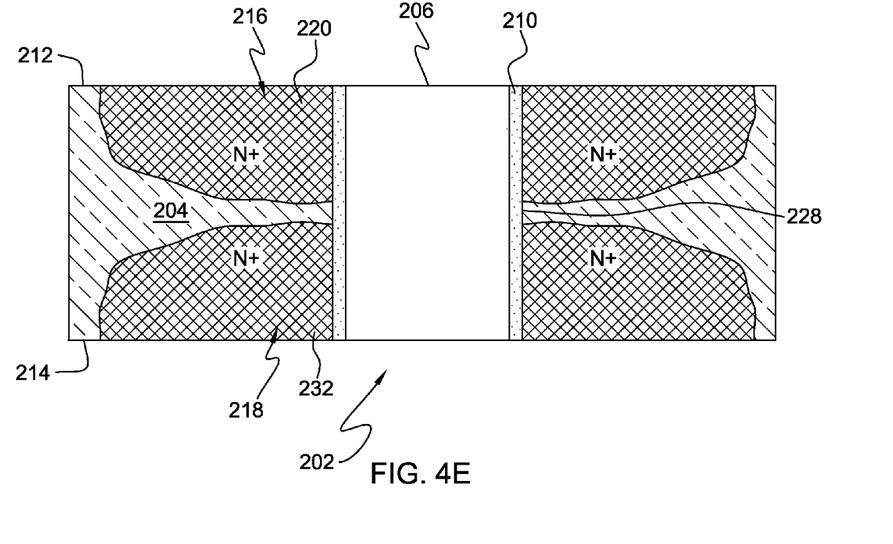
FIG. 4E illustrates a stage in the manufacture of the switchable through-silicon via field-effect transistor of FIG. 2A, subsequent to the stage of FIG. 4D.

In FIG. 4E, an annealing process is applied to first series of ion dopants 222 and first supplemental series of ion dopants 224 which causes the first series and supplemental series of ion dopants 222 and 224 to expand in volume. For example, the annealing process causes the ion dopants to expand and bow outwards, away from top surface 212 of semiconductor chip 204 and away from TSV 206 to form first toroid of ion dopants 220.

The foregoing steps illustrated in FIGS. 4C, 4D, and 4E for top surface 212 are then repeated at the bottom surface 214 of semiconductor chip 204 to form bottom toroid of ion dopants 232.

Figure 4F:
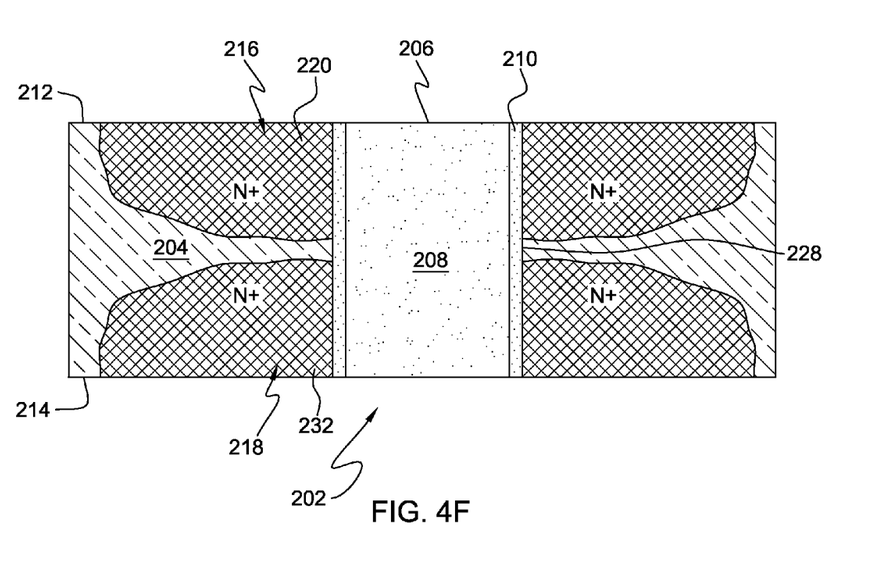
FIG. 4F illustrates a stage in the manufacture of the switchable through-silicon via field-effect transistor of FIG. 2A, subsequent to the stage of FIG. 4E.

In FIG. 4F, TSV 206 is filled with conductive material 208 to provide an electrical pathway vertically through semiconductor chip 204. Conductive material 208 may be a metal such as tungsten, or may be another conducting material such as doped poly-silicon.

The description above has been presented for illustration purposes only. It is not intended to be an exhaustive description of the possible embodiments. One of ordinary skill in the art will understand that other combinations and embodiments are possible.

What is claimed is:

1. A field-effect transistor comprising:
    a gate comprising a via extending through a semiconductor chip substrate from one surface to an opposite surface of the semiconductor chip substrate;
    a source comprising a first toroid of ion dopants implanted in the semiconductor chip substrate surrounding one end of the via on the one surface of the semiconductor chip substrate; and
    a drain comprising a second toroid of ion dopants implanted in the semiconductor chip substrate surrounding an opposite end of the via on the opposite surface of the semiconductor chip substrate.

2. The field-effect transistor of claim 1, wherein the via is substantially perpendicular to the semiconductor chip substrate.

3. The field-effect transistor of claim 1, wherein the one surface comprises a first circuitized surface of the substrate and wherein the opposite surface comprises a second circuitized substrate.

4. The field-effect transistor of claim 1, wherein the source is electrically coupled to a first integrated circuit functional unit on the one side of the semiconductor chip substrate and the drain is electrically coupled to a second integrated circuit functional unit on the opposite side of the semiconductor chip substrate.

5. The field-effect transistor of claim 1, wherein the source is electrically coupled to a first integrated circuit functional unit on a second semiconductor chip and the drain is electrically coupled to a second integrated circuit functional unit on a third semiconductor chip substrate.

6. The field-effect transistor of claim 1, further comprising a control line electrically connecting the via to control logic for switching the field-effect transistor on and off.

7. The field-effect transistor of claim 1, wherein the first toroid of ion dopants is substantially semispherical and the second toroid of ion dopants is substantially semispherical.

8. The field-effect transistor of claim 1, wherein the first toroid of ion dopants comprises a first series of ion dopants implanted at a 45 degree angle relative to the one surface of the semiconductor chip substrate and the second toroid of ion dopants comprises a second series of ion dopants implanted at a 45 degree angle relative to the opposite surface of the semiconductor chip substrate.

9. The field-effect transistor of claim 8:
wherein the first toroid of ion dopants further comprises a first supplemental series of ion dopants; and
wherein the second toroid of ion dopants further comprises a second supplemental series of ion dopants.

10. The field-effect transistor of claim 9, wherein the first and second supplemental series of ion dopants are implanted substantially parallel to the one surface of the semiconductor chip substrate.

11. A field-effect transistor comprising:
a via extending through a semiconductor chip substrate from one surface to an opposite surface of the substrate;
a first series of ion dopants implanted in the semiconductor chip substrate at a first energy level surrounding one end of the via on the one surface of the semiconductor chip substrate;
a second series of ion dopants implanted in the semiconductor chip substrate at the first energy level surrounding an opposite end of the via on the opposite surface of the semiconductor chip substrate;
a first supplemental series of ion dopants implanted at a second energy level in the semiconductor chip substrate surrounding the via at the one end of the via; and
a second supplemental series of ion dopants implanted at the second energy level in the semiconductor chip substrate surrounding the via at the one end of the via;
wherein the first series of ion dopants is implanted at a 45 degree angle relative to the one surface and the second series of ion dopants is implanted at a 45 degree angle relative to the opposite surface; and
wherein the first and second supplemental series of ion dopants are implanted substantially parallel to the one surface of the semiconductor chip substrate.

* * * * *